United States Patent [19]

Munakata et al.

[11] Patent Number: 5,168,095
[45] Date of Patent: Dec. 1, 1992

[54] METHOD FOR SYNTHESIZING A COMPOSITE OXIDE BY CITRATING PROCESS

[75] Inventors: Fumio Munakata, Tokyo; Mitsugu Yamanaka; Susumu Hiyama, both of Kanagawa, all of Japan

[73] Assignees: Nissan Motor Company Ltd.; Seimi Chemical Co. Ltd., both of Kanagawa, Japan

[21] Appl. No.: 657,942

[22] Filed: Feb. 21, 1991

Related U.S. Application Data

[63] Continuation of Ser. No. 403,358, Sep. 6, 1989, abandoned.

[30] Foreign Application Priority Data

Sep. 7, 1988 [JP] Japan .................... 63-222282

[51] Int. Cl.$^5$ ................ H01B 12/00; C04B 25/50; C01G 37/14
[52] U.S. Cl. ........................ 505/1; 505/737; 423/593; 423/594; 423/604; 423/635; 423/637; 423/641; 423/595; 423/596; 423/567 R; 423/598; 423/599; 423/605; 423/607; 423/606; 423/608; 423/609; 423/617; 423/618; 423/624; 501/123; 501/126; 501/134; 501/152
[58] Field of Search ............ 505/1, 787; 423/593, 423/594, 604, 635, 637, 641, 595, 596, 567, 598, 599, 605, 607, 606, 608, 609, 617, 618, 624; 562/584

[56] References Cited

U.S. PATENT DOCUMENTS

4,060,535 11/1977 Cinco ...................... 562/584

OTHER PUBLICATIONS

Marcilly et al., "Preparation of Highly Dispersed Mired Oxides and Oxide Solid Solutions by Pyrolysis of Amorphous Organic Precursors", Jorn Am Cer Soc vol. 53(1), 1970.
Dunn et al., "Properties of Superconducting Oxides Prepared by the Amorphous Citrate Process", Adv Cer Matl vol. 2(3B) 1987 pp. 343–345.
College Chemistry 6ed, 1980, 1004–1005.
*Chemical and Process Technology Encyclopedia*, Considine-ed., pp. 219-221, 1975.

*Primary Examiner*—Karl Group
*Assistant Examiner*—Melissa Bonner
*Attorney, Agent, or Firm*—Leydig, Voit & Mayer

[57] ABSTRACT

A composite oxide synthesized by a citrating process and utilized in functional ceramics materials is prepared by the following process. Co-precipitants or mixtures of at least one component selected from the group consisting of carbonates, basic copper and/or hydroxides of elements which compose a composite oxide are reacted with citric acid in an aqueous solution or in an organic solvent. The elements are selected from at least one element of the group consisting of Y, rare earth elements, transition elements, and alkali metal or alkaline earth metal elements. The citrate compound formed is baked to complete the composite oxide.

The composite oxide synthesized by this invention has superconduction at the most temperature of 93° K. with excellent Meissner effect.

27 Claims, 13 Drawing Sheets

METHOD FOR SYNTHESIZING A COMPOSITE OXIDE BY CITRATING PROCESS

This application is a continuation of application Ser. No. 07/403,358, filed Sep. 6, 1989 abandoned.

BACKGROUND OF THE INVENTION

1. Technical Field

This invention relates to a method for the synthesis of composite oxides by an improved citrating process.

2. Background Art

Generally, citrate forming processes are applied in forming particles of functional ceramic materials utilized in such as magnetic substances, catalysts, sensors, superconductors, dielectric substances and optical materials.

C. Marcilly et al. in the Journal of the American Ceramic Soc., 53, 56 (1970) discloses a method for synthesizing a composite oxide by mixing citric acid with nitrates and/or acetates of metals. Recently, Hirabayasi et al. in the Journal of Japan Inst., metals, 26, 10 (1987) discloses a method for synthesizing a composite oxide having superconductivity at high temperatures by mixing nitrates of Y, Ba and/or Cu with citric acid and ethylene glycol.

However, these methods for forming citrates are methods whereby citric acid is merely added to an aqueous solution of nitrates and/or acetates. Furthermore, as added citrates are merely dissolved, metallic nitrates and/or metallic acetates and citrates coexist in the solution. In this stage, citrates are not formed. Citrates are obtained after heating and condensing this solution and dehydrating. However, this procedure causes great amounts of poisonous gases such as nitric acid ($HNO_3$), nitrogen oxide ($NO_x$), acetic acid ($CH_3COOH$) to be found.

Furthermore, after dehydration, gelated citrate adheres strongly and viscidly to its container, this causes difficulty in treating and decreases the overall yield.

Moreover, when baking citrate, it forms an oily compound and burns fiercely with much black smoke, which is very dangerous. This caramel-like compound bulges out at high temperatures and causes difficulty in finishing the baking.

Thus, the above mentioned prior art has many problems in both the pollution and system aspects when applied industrially.

It is therefore an object of this invention to provide a method for synthesizing a composite oxide which produces no poisonous gases during the procedure.

It is another object of this invention to provide a method for synthesizing a composite oxide which can obtain high yields.

It is further object of this invention to provide a method for synthesizing a composite oxide having homogeneity and high quality.

It is additional object of this invention to provide a method for synthesizing a composite oxide which can be established for mass productive industrialization.

SUMMARY OF THE INVENTION

This invention relates to a method for synthesizing composite oxides, utilized for ceramic materials, by a citrating process which produces no poisonous gases during the procedure.

Co-precipitants or a mixture of carbonates, basic-carbonates and/or hydroxides of elements which compose a composite oxide are reacted with citric acid in an aqueous solution or organic solvent. The elements are selected from at least one element of the group consisting of Y, rare earth elements, transition elements, and alkali metal or alkaline earth metal elements. The formed citrate compound is baked to complete the composite oxide.

According to this invention, micro particles of composite citrate can be obtained in a slurry before dehydration which have no contamination. When dehydrated, it consists only of micro particles of composite citrate and water. Therefore, no poisonous gases are produced during citrate baking.

Synthesized citrate shows high homogeneity when analyzed by EPMA and/or X-ray diffraction methods. According to further baking, it shows superconduction at a transition temperature of 93° K. and gives the Meissner effect to a high degree.

This method for synthesizing composite oxides using carbonates and/or hydroxides has excellent industrial utility compared with the prior method using nitrates and/or acetates.

BRIEF DESCRIPTION OF THE DRAWINGS

The present invention will be understood more clearly from the preferred embodiments described herebelow and from the appended drawings which illustrate the detailed composition of the embodiments, which, however, should not be taken to limit the invention but are for explanation and understanding only.

In the drawings:

FIG. 3-1 to FIG. 9-1 are charts showing the EPMA analysis results of composite oxides including Ba and Y in EXAMPLEs 1 to 4 and CONTROLs 1 to 3, FIG. 3-2 to FIG. 9-2 are charts showing the EPMA analysis results of composite oxides including Cu and Y in EXAMPLEs 1 to 4 and CONTROLs 1 to 3.

DETAILED DESCRIPTION OF THE PREFERRED EMBODIMENTS

Figure 1:
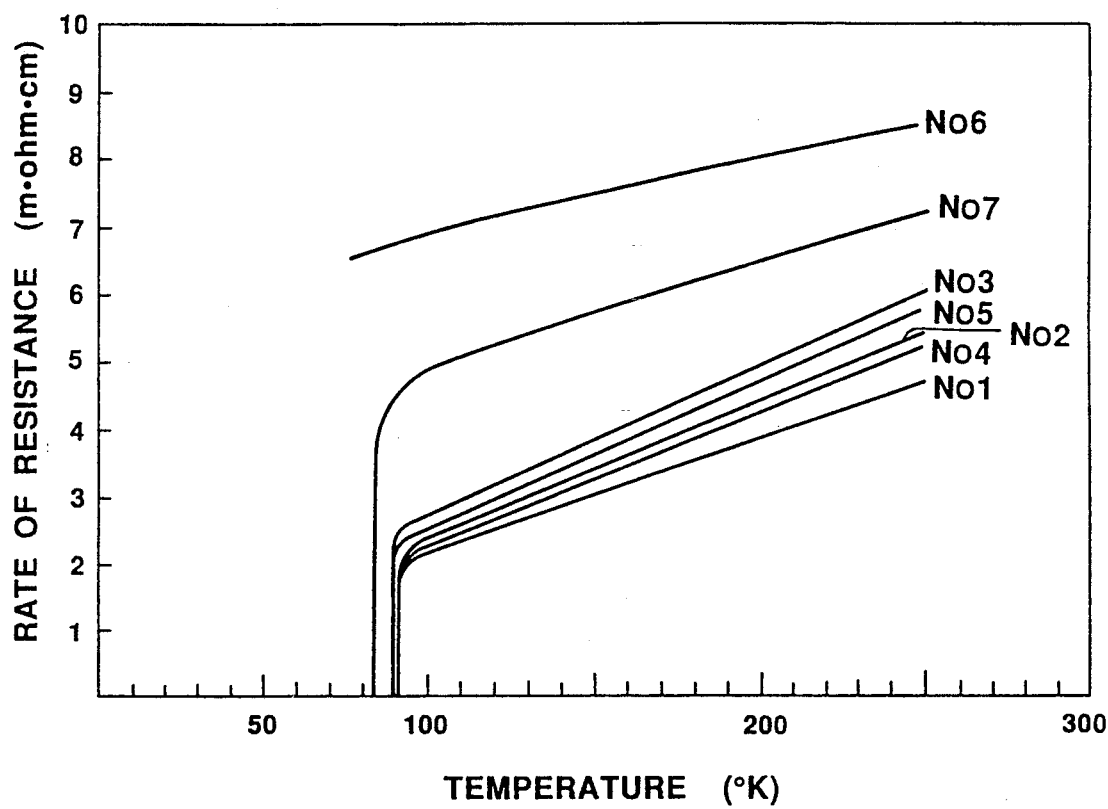
FIG. 1 is a graph showing a relationship between the temperature (°K.) and resistance rate of composite oxides of EXAMPLE 1 to 4 and CONTROL 1 to 3 respectively designated 1 to 4 and 5 to 7 in the figures.

In this invention, La, Nd and/or Gd may be used as the rare earth elements, Cu, Ni and/or Co as the transition metal elements, K and/or Na as the alkali metal elements and Ba, Sr and/or Ca as the alkaline earth metal elements.

Synthesizing temperatures composite citrates are preferable in a range of 40° to 120° C., more specifically at 65°±5° C. Additionally, temperatures for dehydrating are preferable in a range of 50° to 120° C., more specifically at 90°±5° C. Furthermore, suitable conditions for pre-baking are at temperatures of 800° to 900° C. for at least 4 hours and suitable baking conditions are at temperatures of 940° to 960° C. for at least 2 hours. Then the composite citrate will show superconductivity at 93° K.

The invention will be understood more concretely by the following examples of superconductor formation.

EXAMPLE 1

30.28 g of yttrium carbonate (55.88 wt % as $Y_2O_3$), 59.17 g of barium carbonate (77.68 wt % as BaO) and 50.42 g of basic copper carbonate (70.95 wt % as CuO) were milled and mixed in an atomizing mill (Tokyo Atomizer TASM-1). 86.4 g of citric acid and 600 g of purified water were added to 100.0 g of mixture prepared previously. The reaction was performed at 65°±5° C.

After termination of the reaction, the slurry obtained was dehydrated at 90° C. 130.8 g of composite citrate was obtained. Pre-baking was performed at 850° C. for 6 hours, then the slurry was annealed in an electric furnace. The amount of pre-baked compound was 71 g. This can be milled in an agate mortar or a ball mill. 0.4 to 0.8 g of milled compound was pressurized at 100 to 200 kg/cm², compacted into 10 mm of diameter and 1 to 2 mm thick. The compacted compound was baked again at 950° C. for 9 hours, then pellets of composite oxide were obtained.

EXAMPLE 2

30.28 g of yttrium carbonate (55.88 wt % as $Y_2O_3$), 59.17 g of barium carbonate (77.68 wt % as BaO) and basic-copper carbonate (70.95 wt % as CuO) were milled and mixed in a ball mill (volume:900 ml, alumina) for 2 to 3 hours. 86.4 g of citric acid and 250 g of purified water were added to 100.0 g of the prepared mixture. Reaction was performed at a temperature of 90° C.

Then using the procedure as disclosed in EXAMPLE 1, pellets of composite oxide were obtained.

EXAMPLE 3

$Y_2O_3$ was dissolved in nitric acid then 1.771 M/l of a solution of $Y(NO_3)_3$ was prepared. 84.60 ml (0.15 mol) of this solution, 78.34 g (0.30 mol) of $Ba(NO_3)_2$ and 108.6 g (0.45 mol) of $Cu(NO_3)_2 3H_2O$ were dissolved in water. Then 625 ml of 20 wt % of $K_2CO_3$ (125 g, 0.90 mol as $K_2CO_3$) was added little by little to co-precipitate carbonate of Y, Ba and Cu. Thus 140.2 g of co-precipitants were obtained by dehydrating at 80° C. for 16 hours after rinsing with water.

100.0 g of this co-precipitant, 84.7 g of citric acid and 600 g of purified water were mixed and reacted at a temperature of 65°±5° C.

After the reaction was terminated, obtained slurry was dehydrated at 90° C. and thus 127.9 g of composite citrate was obtained.

Then using the procedure as disclosed in EXAMPLE 1, the pellets of composite oxide were completed (however, the amount of pre-baked compound became 69.1 g).

EXAMPLE 4

21.39 g of $Y(OH)_3$ (79.09 wt % as $Y_2O_3$), 44.98 g of $Cu(OH)_2$ (79.51 wt % as CuO) and 59.17 g of barium carbonate (77.68 wt % as BaO) were milled and mixed in an atomizing mill. 96.3 g of citric acid and 800 g of purified water were added to 100.0 g of the prepared mixture. The reaction was performed at a temperature of 90°±5° C. Then the obtained slurry was dehydrated and 145.7 g of composite citrate was obtained.

Then using the procedure as disclosed in EXAMPLE 1, the pellets of composite oxide were completed (however, the amount of the pre-baked compound became 79.0 g).

Figure 2:
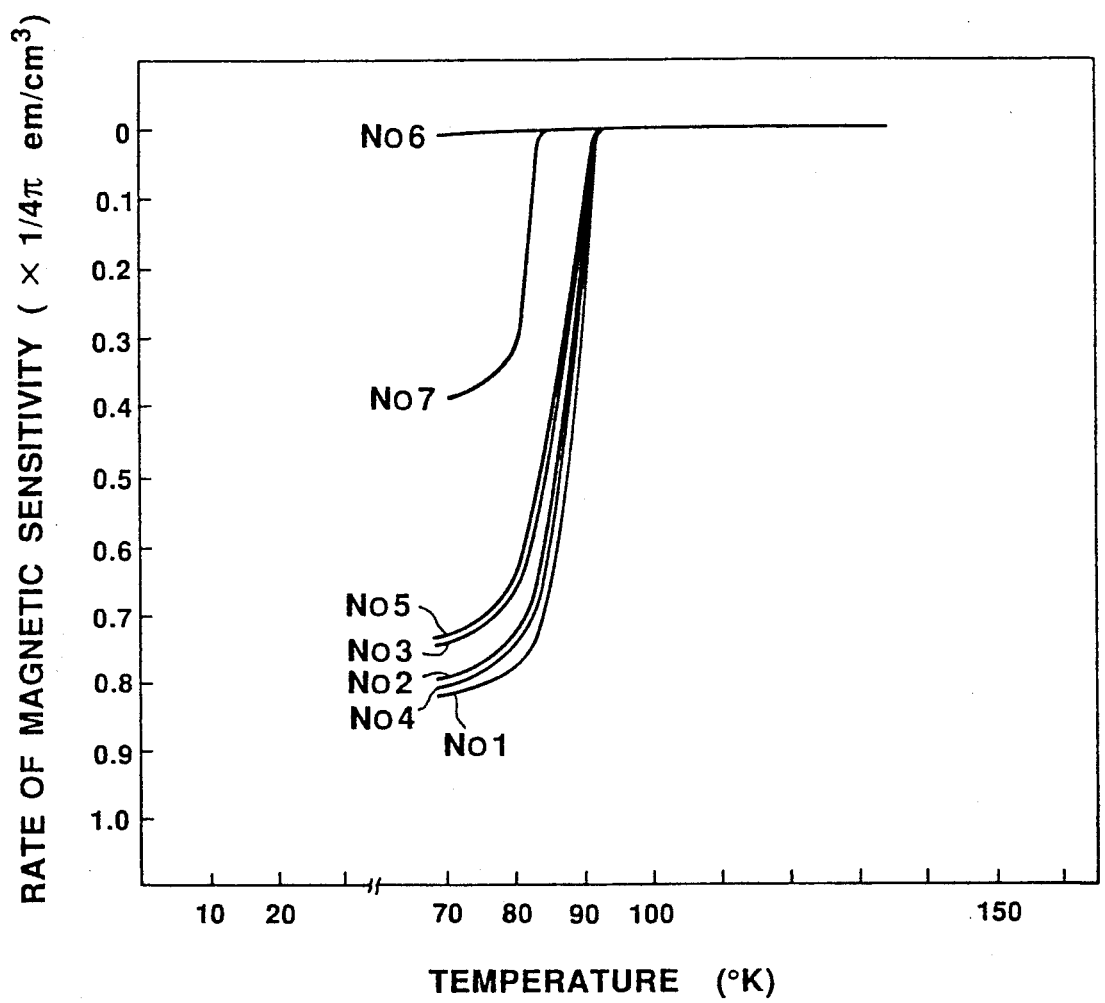
FIG. 2 is a graph showing a relationship between the temperature (°K.) and magnetic sensitivity of composite oxides of EXAMPLE 1 to 4 and CONTROL 1 to 3.
Figures 1, 3:
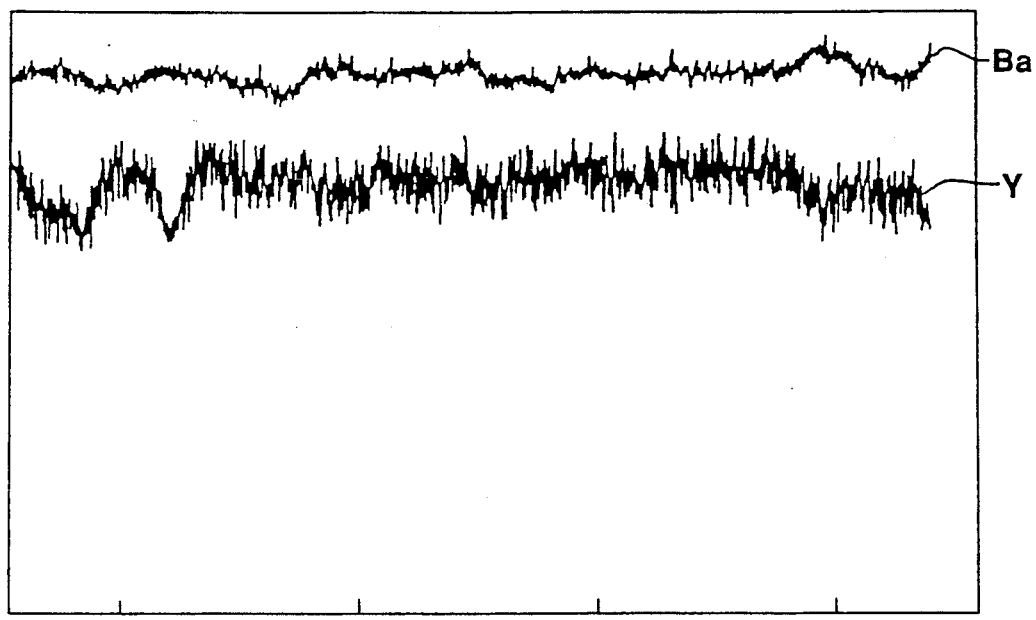
Figures 2, 3:
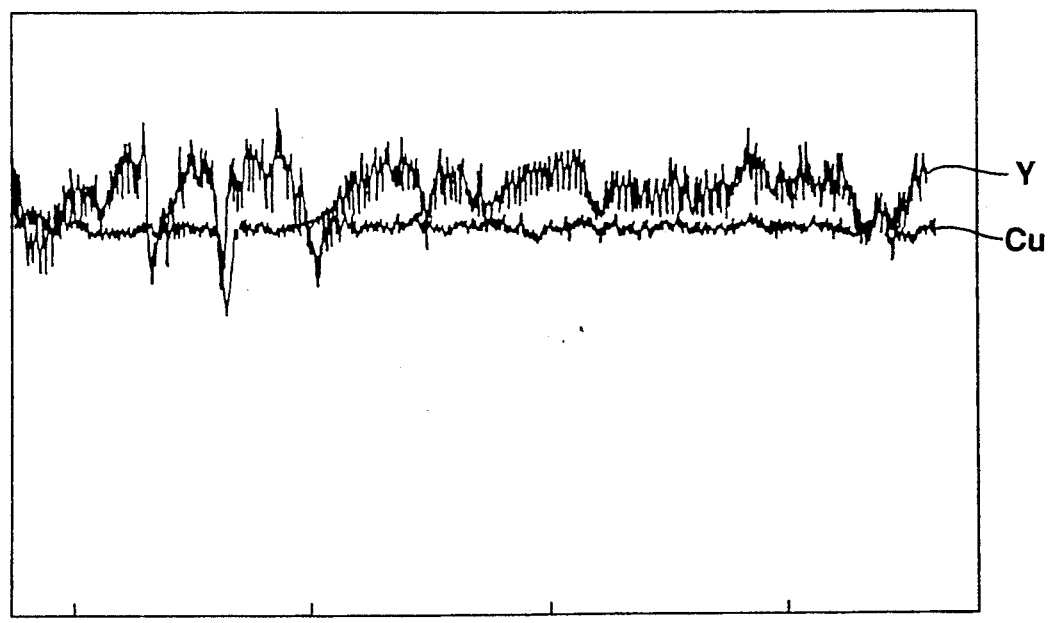
Figures 1, 4:
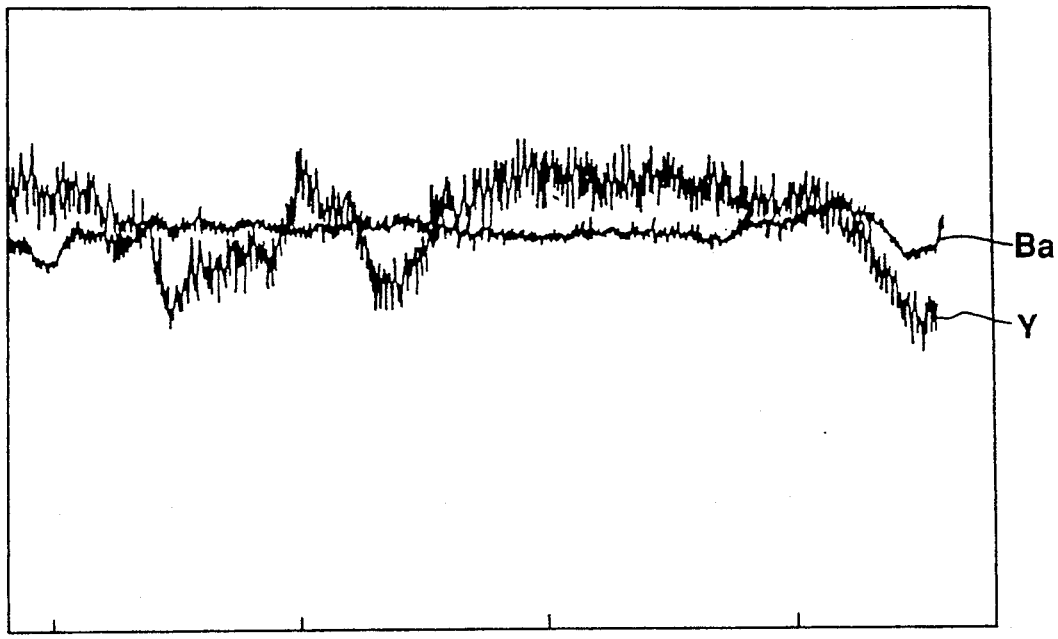
Figures 2, 4:
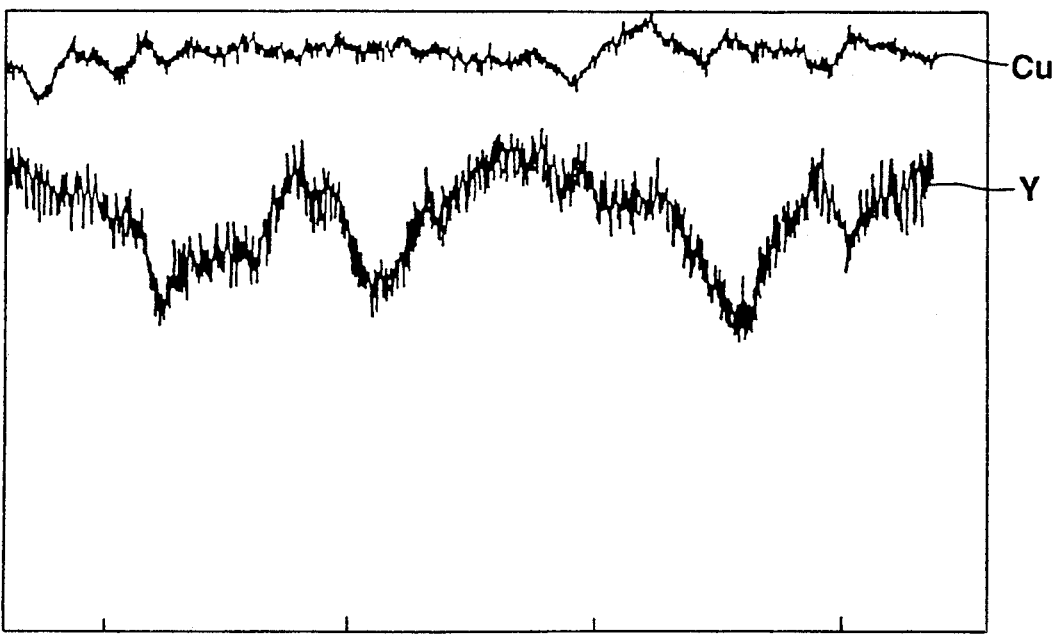
Figures 1, 5:
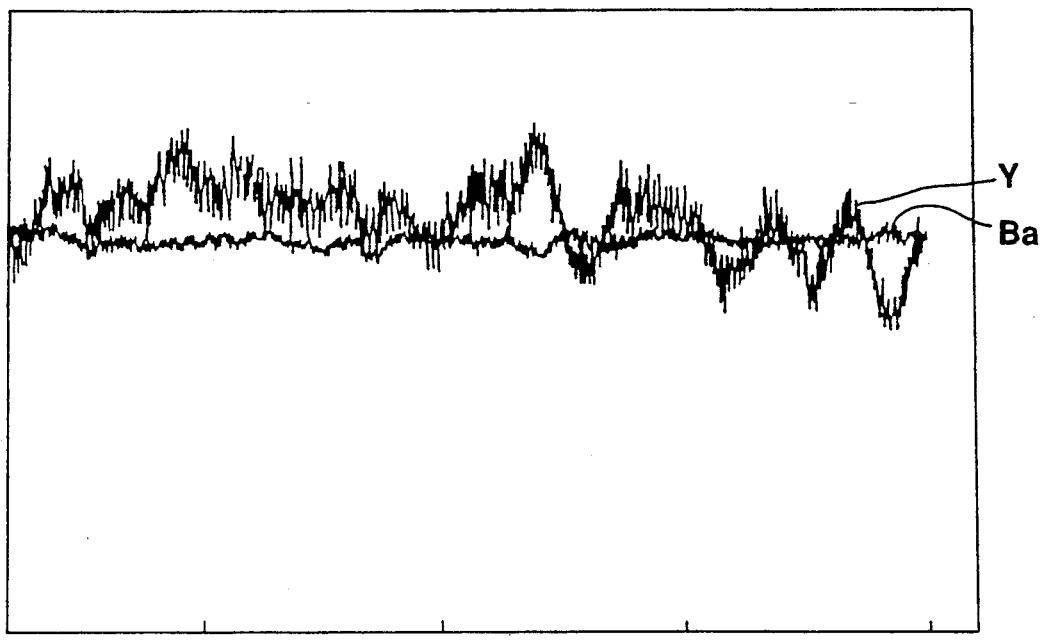
Figures 2, 5:
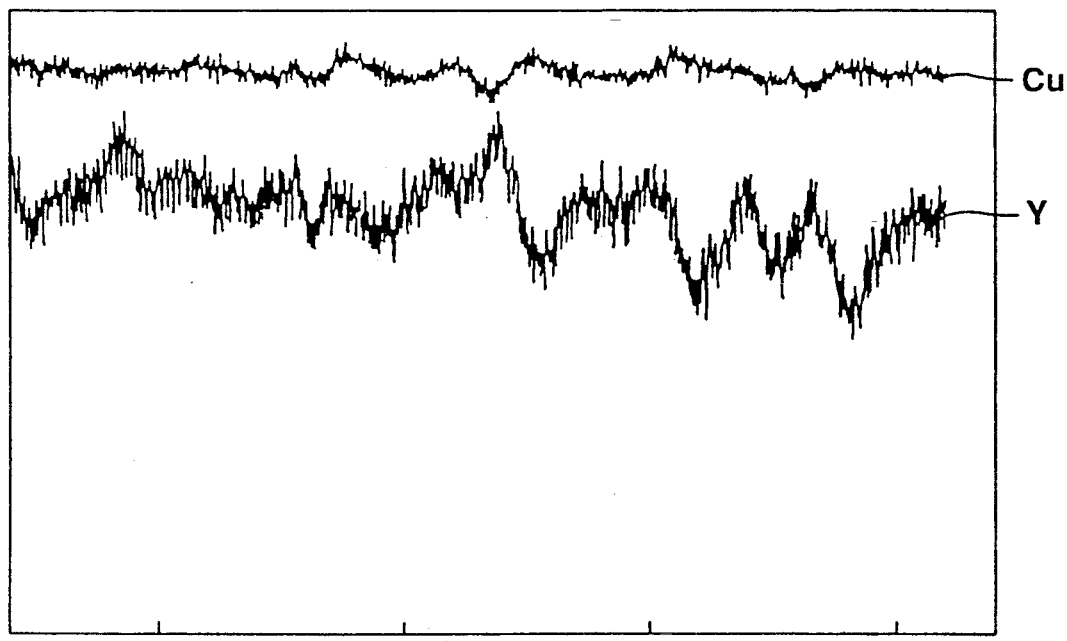
Figures 1, 6:
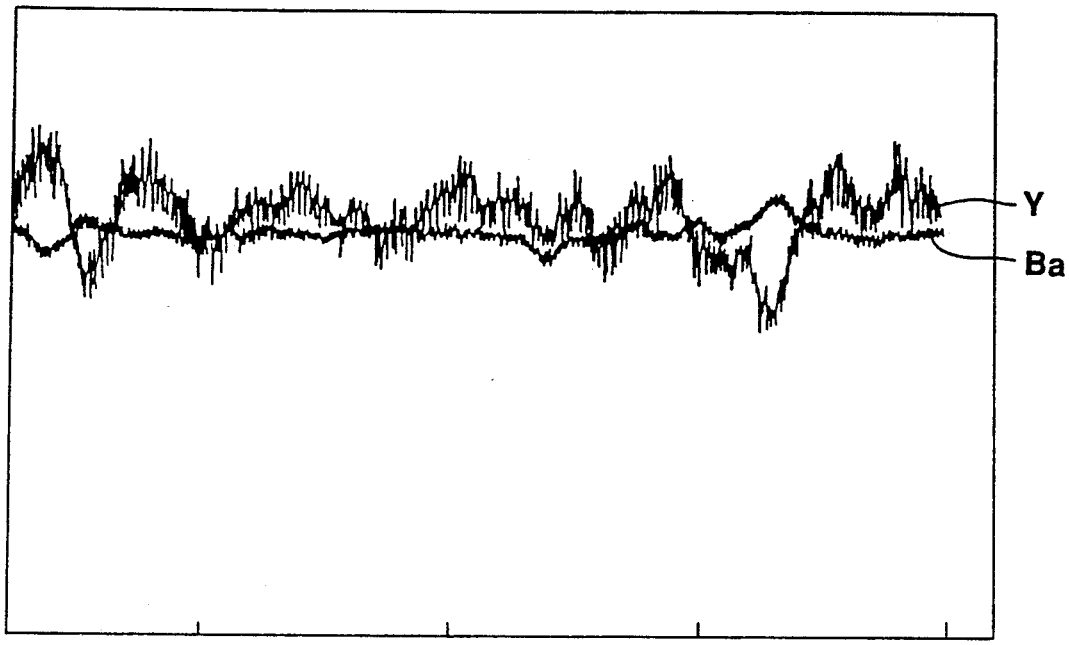
Figures 2, 6:
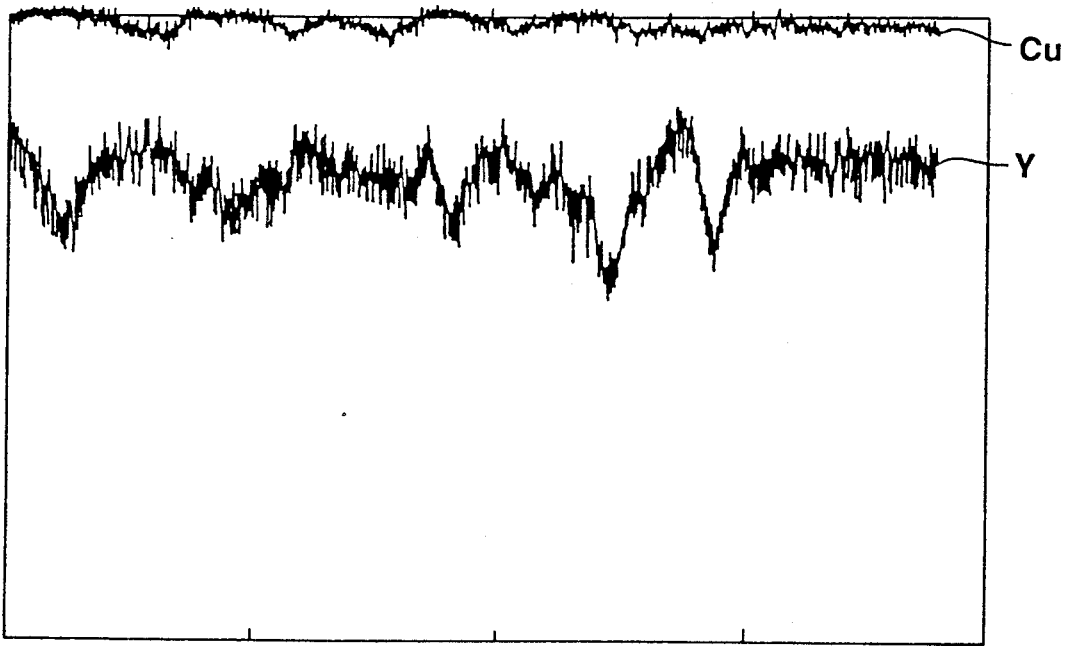
Figures 1, 7:
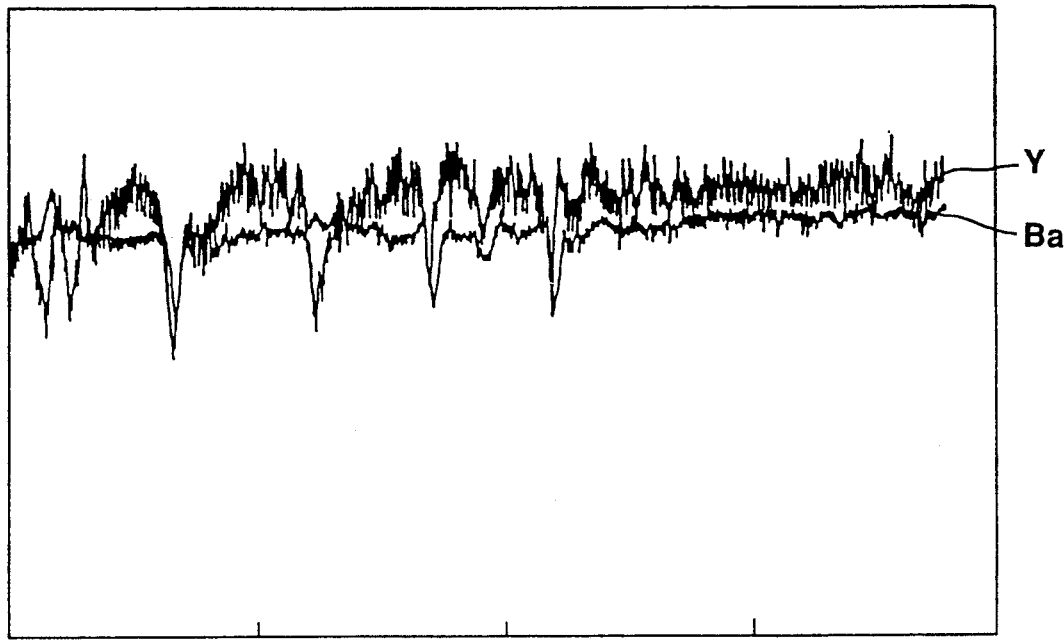
Figures 2, 7:
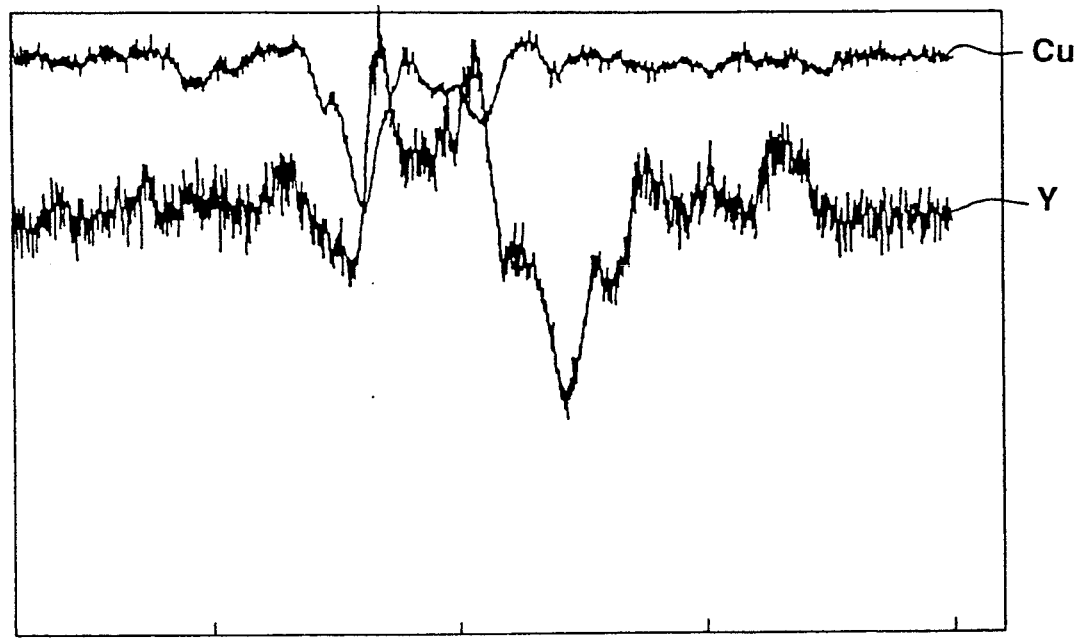
Figures 1, 8:
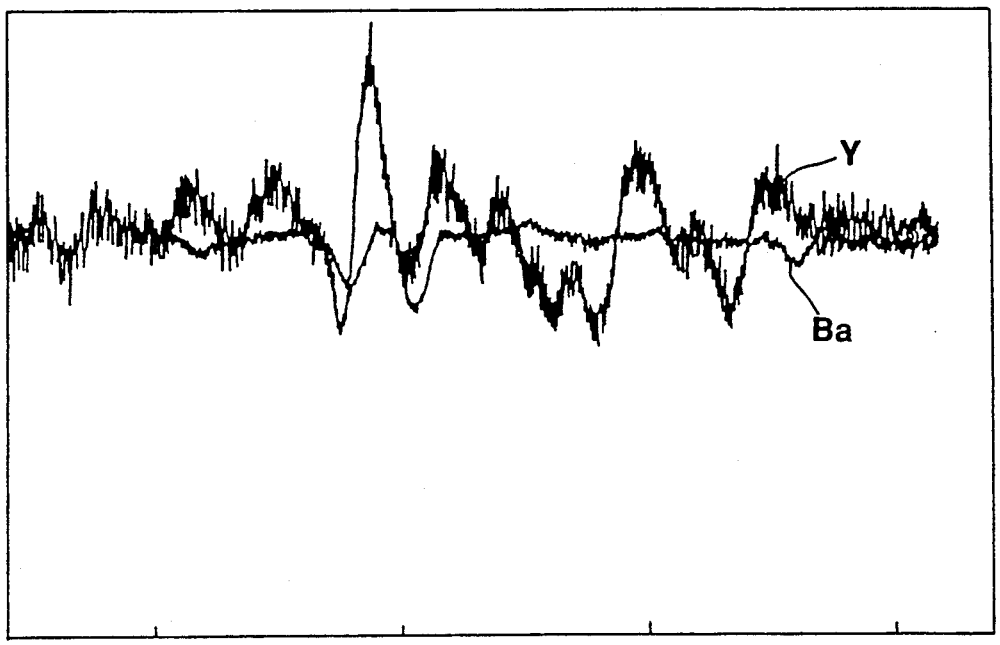
Figures 2, 8:
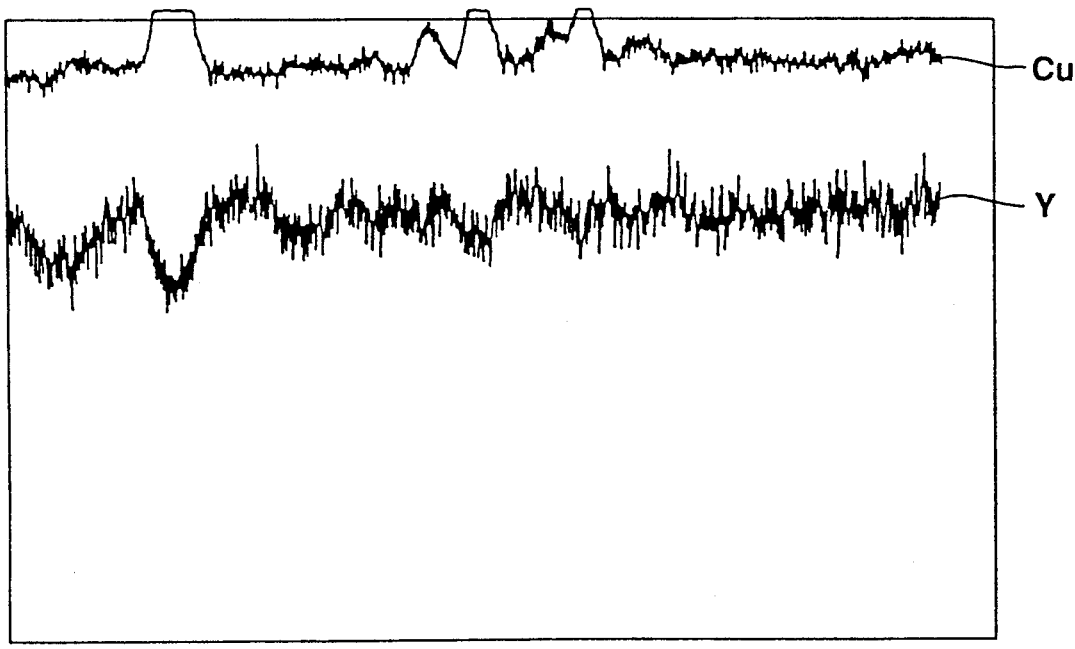
Figures 1, 9:
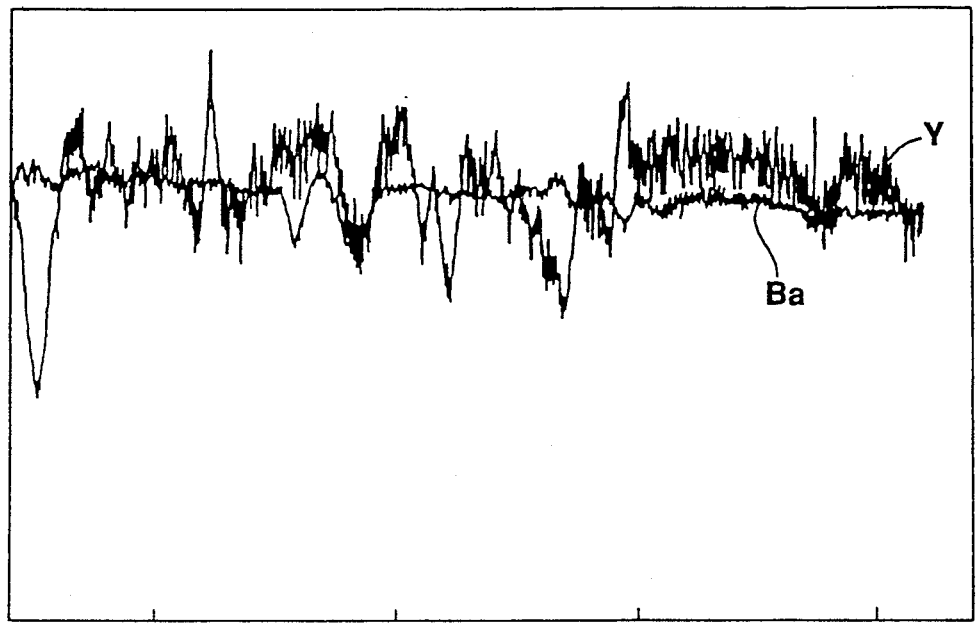
Figures 2, 9:
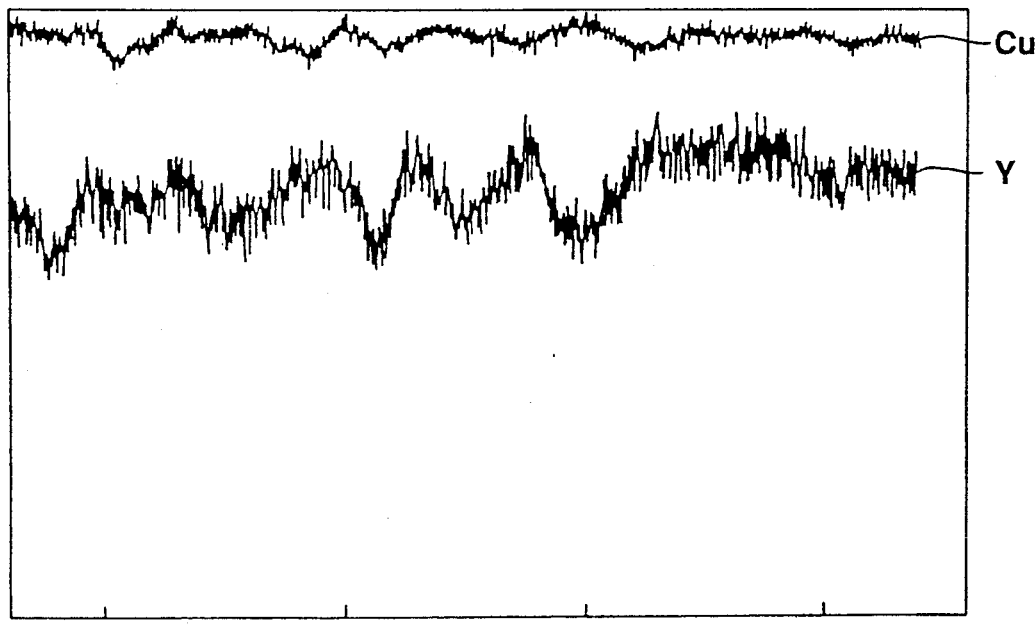
Figure 10:
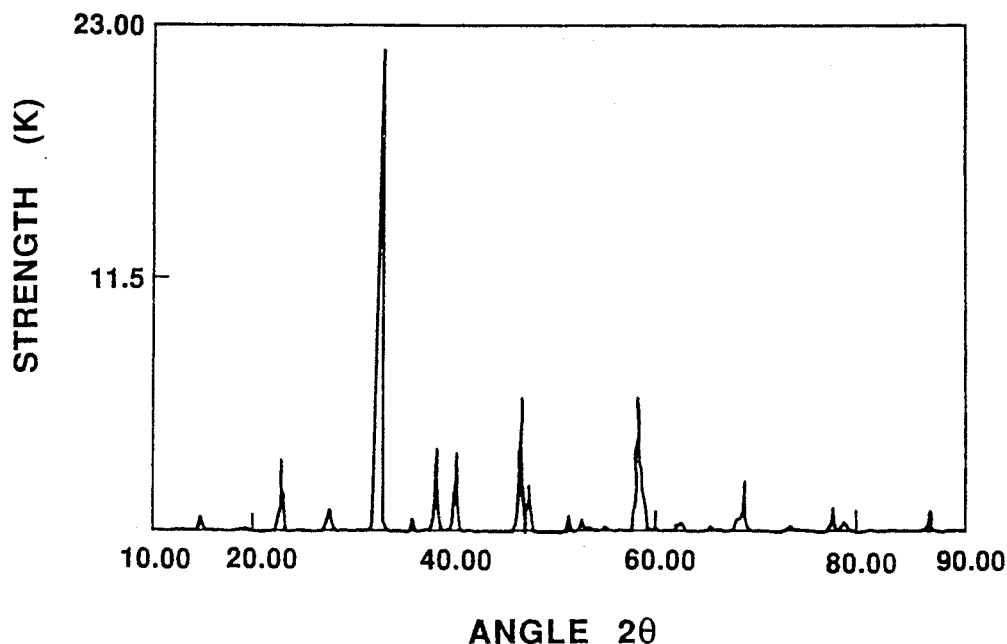
FIGS. 10 to 16 are charts showing X-ray diffraction pattern of composite oxides of EXAMPLEs 1 to 4 and CONTROLs 1 to 3.
Figure 11:
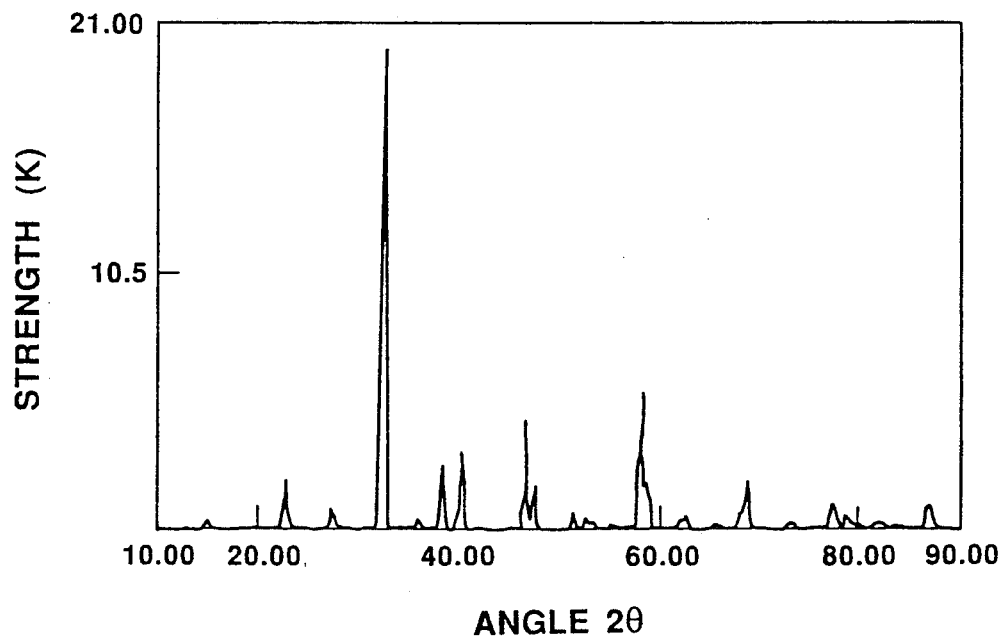
Figure 12:
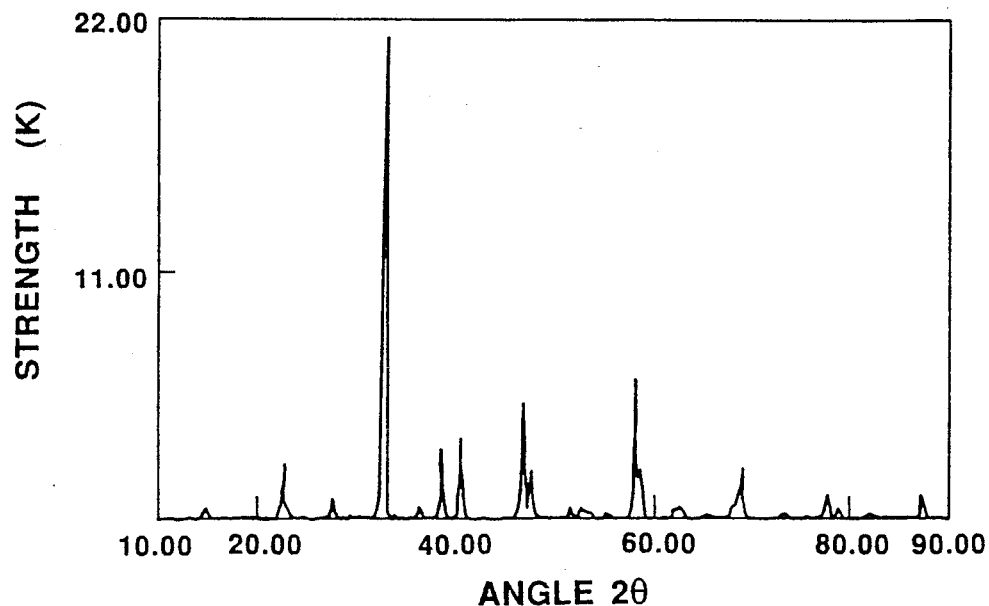
Figure 13:
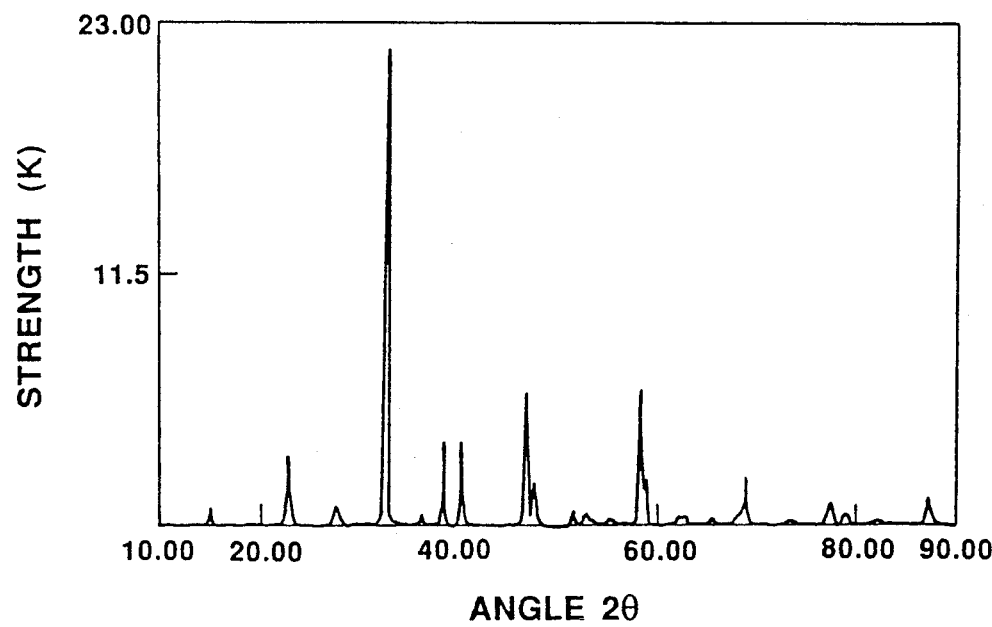
Figure 14:
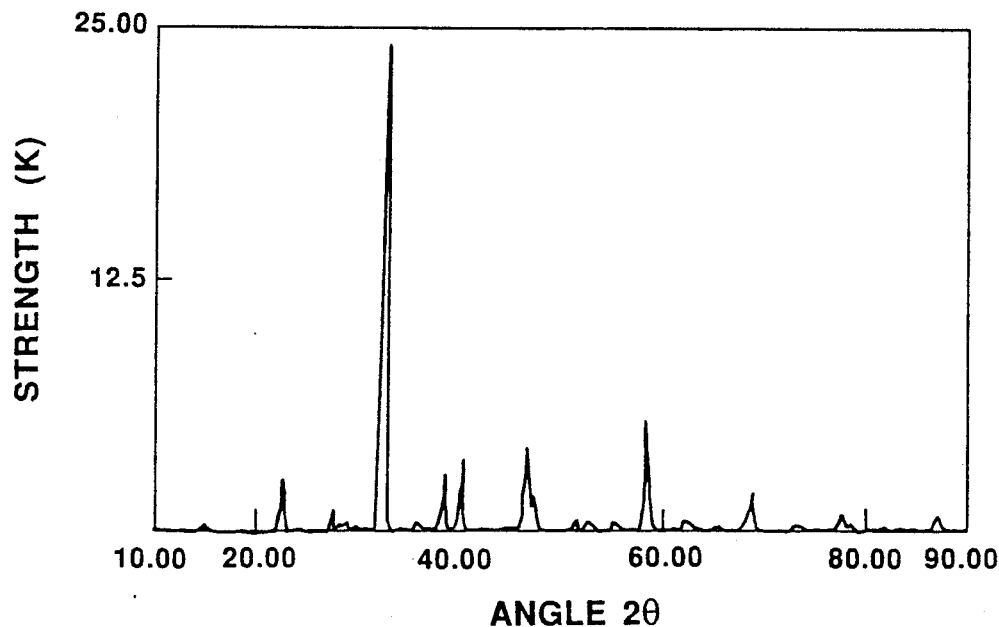
Figure 15:
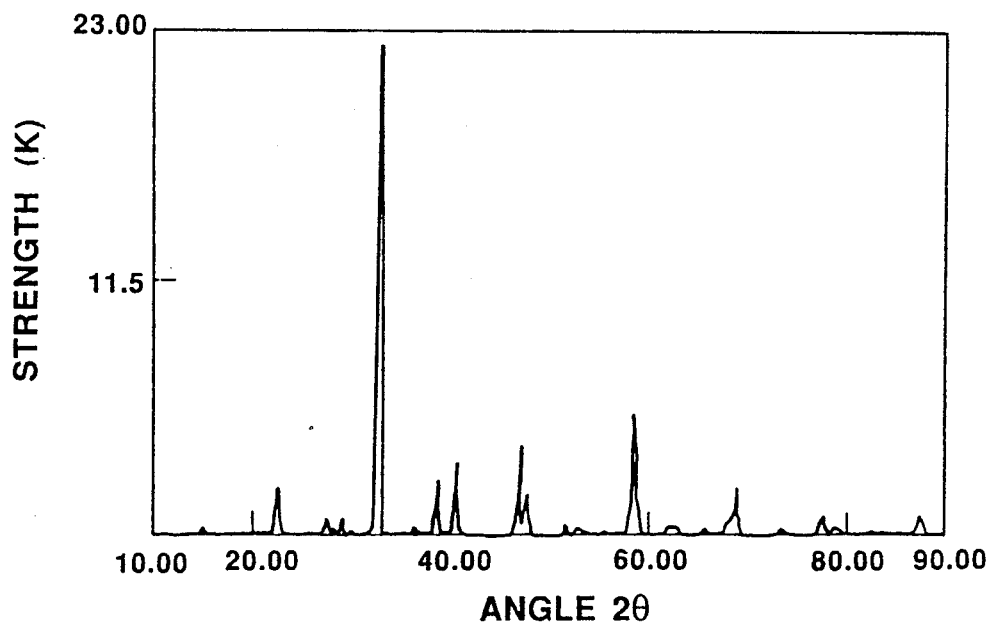
Figure 16:
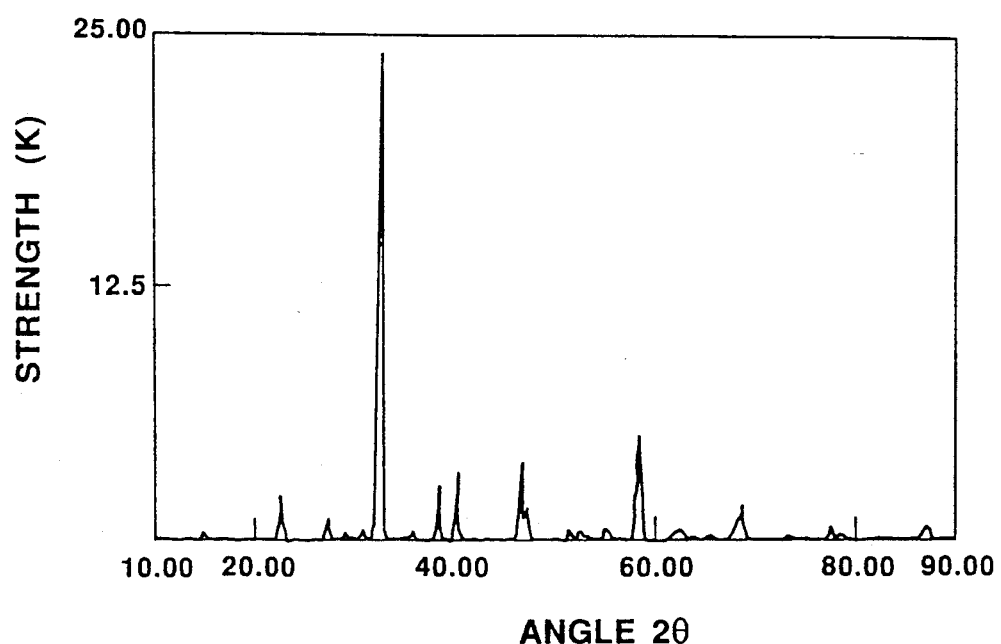

CONTROL 1 (designated by 5 in FIGS. 1 and 2).

16.92 ml of 1.771 M/l of $Y(NO_3)_3$ solution (0.030 mol) was prepared as in EXAMPLE 3, 15.66 g of $Ba(NO_3)_2$ (0.060 mol) and 21.40 g of $Cu(NO_3)_2 3H_2O$ (0.090 mol) were dissolved in 200 g of purified water. 17.28 g of citric acid (0.082 mol) was added to this solution and stirred substantially.

Then the obtained solution was condensed by dehydration with substantial stirring on a hot plate. During this stage, about 18 g (0.39 mol) of $NO_x$ was produced as a form of $NO_2$. $H_2O$ was also produced. The obtained citrate was gelated. Further dehydration caused the citrate to form a caramel-like compound, which adhered to an interior wall of a reactor. The adhered citrate was scraped off and milled. It was pre-baked at 850° C. for 9 hours then annealed. The amount of pre-baking compound was about 13.2 g (the amount lost was caused by adhesion to the reactor).

Then using the procedure as disclosed in EXAMPLE 1, the pellets of composite oxide were completed.

CONTROL 2 (designated by 6 in FIGS. 1 and 2).

17.14 g of yttrium oxide (98.7 wt % as $Y_2O_3$), 59.17 g of barium carbonate (77.68 wt % as BaO) and 50.42 g of basic-copper carbonate (70.96 wt % as CuO) were milled and mixed in a ball mill for 3 hours. The obtained mixture was pre-baked at 850° C. for 9 hours then annealed.

Then using the procedure as disclosed in EXAMPLE 1, the pellets of composite oxide were completed (however, the amount of pre-baked compound became 72 g).

CONTROL 3 (designated by 7 in FIGS. 1 and 2).

The baked pellets which were obtained in control 2 were milled in an agate mortar, then pressurized again at 950° C. for 12 hours.

The transition temperature (Tc) and the rate of magnetization were examined in above mentioned composite oxide pellets of EXAMPLEs 1 to 4 and CONTROLs 1 to 3. The results are shown in the following Table 1., and FIGS. 1 and 2 of the drawings. FIG. 1 shows the results of measuring Tc (the relationship between the temperature (°K.) and rate of resistance), FIG. 2 shows the results of measuring the Meissner effect (the relationship between the temperature and rate of magnetic sensitivity). In these drawings, Nos. 1 to 7 correspond to each of the composite oxides which are indicated in Table 1.

TABLE 1

| Sample | No. | Tc (°K.) | Rate of magnetic sensitivity (× ¼πemu/cm³) |
|---|---|---|---|
| EXAMPLE 1 | 1 | 93 | −0.83 |
| EXAMPLE 2 | 2 | 91 | −0.80 |
| EXAMPLE 3 | 3 | 90 | −0.75 |
| EXAMPLE 4 | 4 | 92 | −0.82 |
| CONTROL 1 | 5 | 91 | −0.74 |
| CONTROL 2 | 6 | <77 | 0 |
| CONTROL 3 | 7 | 84 | −0.40 |

Subsequently, EPMA analysis was applied for the composite oxides of EXAMPLEs 1 to 4 and CONTROLs 1 to 3 (Nos. 1 to 7 in the Table 1).

The analytic results of composite oxides including Ba and Y are shown in FIGS. 3-1, 4-1, 5-1, 6-1, 7-1, 8-1 and 9-1. The analytic results of composite oxides including Cu and Y are also shown in FIGS. 3-2, 4-2, 5-2, 6-2, 7-2, 8-2 and 9-2. Additionally, the analytic results by X-ray diffraction of the composite oxides are shown in FIGS. 10 to 16.

What is claimed is:

1. A method for producing a compound oxide containing at least two metal elements selected from the group consisting of yttrium and a rare earth element, a non-yttrium, non-rare earth metal transition metal element, an alkali metal element and an alkaline earth metal element, said method comprising the steps of:

milling and mixing carbonates of the two metal elements to produce a mixture;

adding citric acid and purified water to said mixture to initiate a reaction to form a slurry;

dehydrating said slurry to form a crystalline citrate composite;

pre-baking said dehydrated slurry;

annealing said pre-baked slurry;

milling said pre-baked and annealed slurry to provide a powder; and baking said powder to form said compound oxide.

2. The method as set forth in claim 1, wherein said rare earth element is selected from the group consisting of La, Nd and Gd.

3. The method as set forth in claim 1, wherein said transition metal element is selected from the group consisting of Cu, Ni and Co.

4. The method as set forth in claim 1, wherein said alkali metal element is selected from the group consisting of K and Na.

5. The method as set forth in claim 1, wherein said alkaline earth metal element is selected from the group consisting of Ba, Sr and Ca.

6. The method as set forth in claim 1, wherein said reacting step comprises:

mixing citric acid in an aqueous solution or in an organic solvent with said co-precipitant to heat the mixture at temperatures in a range from 40° to 120° C. and dehydrating said compound citrate at temperatures in a range from 50° to 120° C.

7. The method as set forth in claim 1, wherein said baking step comprises:

pre-baking said dehydrated citrate at temperatures in a range from 800° to 900° C. for at least 4 hours, annealing and compacting said pre-baked citrate; and baking said compound citrate to form a compound oxide at temperatures in the range of from 940° to 960° C. for at least 2 hours.

8. The method as set forth in claim 6, wherein said heating step is performed at the temperature of 65°±5°.

9. The method as set forth in claim 6, wherein said dehydrating step is performed at the temperature of 95°±5°.

10. A method for producing a superconductive ceramic powder essentially consisting of a compound oxide containing yttrium and a metal selected from the group consisting of rare earth elements, the rare earth element being selected from the group consisting of La, Nd and Gd, a non-yttrium, non-rare earth metal transition metal element selected from the group consisting of Cu, Ni and Co, alkali metal elements selected from the group consisting of K and Na, and alkaline earth metal elements selected from the group consisting of Ba, Sr and Ca, said method comprising the steps of:

milling and mixing said carbonates and hydroxides of said first and second metal elements to produce a mixture, mixing and reacting citric acid in an aqueous solution or in an organic solvent with said mixture to heat the mixture at temperatures in a range from 40° to 120° C.

to form compound citrate, dehydrating said compound citrate mixture at temperatures in a range from 50° to 120° C. to form a crystalline compound citrate, annealing said dehydrated mixture, milling said dehydrated and annealed mixture to provide a powder; and baking the compound citrate at temperatures in a range from 940° to 960° C. for at least two hours.

11. A method of producing compound oxides, the method comprising the steps of:

preparing carbonates of first and second elements of a compound oxide which is expressed by the following formula:

$A_n B_m O_y$ where,

O: oxygen;

y: a number not necessarily an integer;

m: an integer from 1 to 4;

n: an integer from 1 to 6;

A: said first metal element selected from a first group consisting of yttrium (Y), lanthanum (La), cerium (Ce), paraseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), lithium (Li), sodium (Na), potassium (K), rubidium (Rb), cesium (Cs), magnesium (Mg), calcium (Ca), strontium (Sr), barium (Ba), aluminium (Al), and silicon (Si); and B: said second metal element selected from a second group consisting of titanium (Ti), vanadium (V), chromium (Cr), manganese (Mn), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), palladium (Pd), silver (Ag), cadmium (Cd), indium (In), tin (Sn), antimony (Sb), hafnium (Hf), tantalum (Ta), tungsten (W), rhenium (Re), iridium (Ir), thallium (Tl), lead (Pb), and bismuth (Bi);

milling and mixing said carbonates of said first and second metal elements to produce a mixture;

adding citric acid and purified water to said mixture to initiate reaction at a first temperature to form a slurry;

dehydrating said slurry at a second temperature to form a crystalline citrate composite;

pre-baking said dehydrated slurry at a third temperature;

annealing said pre-baked slurry;

milling said pre-baked and annealed slurry to provide a powder; and baking said powder at a fourth temperature that is higher than said third temperature to form said compound oxide.

12. A method of producing compound oxides, the method comprising the steps of:

preparing carbonates of first and second elements of a compound oxide which is expressed by the following formula:

$$A_nB_mO_y$$

where,
O: oxygen;
y: a number not necessarily an integer;
m: an integer from 1 to 4;
n: an integer from 1 to 6;
A: said first metal element selected from a first group consisting of yttrium (Y), lanthanum (La), cerium (Ce), paraseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), lithium (Li), sodium (Na), potassium (K), rubidium (Rb), cesium (Cs), magnesium (Mg), calcium (Ca), strontium (Sr), barium (Ba), aluminium (Al), and silicon (Si); and
B: said second metal element selected from a second group consisting of vanadium (V), manganese (Mn), iron (Fe), cobalt (Co), nickel (Ni), copper (Cu), zinc (Zn), gallium (Ga), molybdenum (Mo), palladium (Pd), silver (Ag), indium (In), tin (Sn), antimony (Sb), tungsten (W), thallium (Tl), lead (Pb), and bismuth (Bi);
milling and mixing said carbonates of said first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;
milling said pre-baked and annealed slurry to provide a powder; and
baking said powder at a fourth temperature that is higher than said third temperature to form said compound oxide.

13. A method of producing compound oxides, the method comprising the steps of:
preparing carbonates of first and second elements of a compound oxide which is expressed by the following formula:

$$A_nB_mO_y$$

where,
O: oxygen;
y: a number not necessarily an integer;
m: an integer from 1 to 4;
n: an integer from 1 to 6;
A: said first metal element selected from a first group consisting of yttrium (Y), lanthanum (La), cerium (Ce), paraseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), lithium (Li), sodium (Na), potassium (K), rubidium (Rb), cesium (Cs), magnesium (Mg), calcium (Ca), strontium (Sr), barium (Ba), aluminium (Al), and silicon (Si); and
B: said second metal element selected from a second group consisting of vanadium (V), manganese (Mn), iron (Fe), cobalt (Co), nickel (Ni), copper (Cu), zinc (Zn), gallium (Ga), indium (In), tin (Sn), tungsten (W), thallium (Tl), lead (Pb), and bismuth (Bi);
milling and mixing said carbonates of said first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;
milling said pre-baked and annealed slurry to provide a powder; and
baking said powder at a fourth temperature that is higher than said third temperature to form said compound oxide.

14. A method of producing compound oxides, the method comprising the steps of:
preparing carbonates of first and second elements of a compound oxide which is expressed by the following formula:

$$A_nB_mO_y$$

where,
O: oxygen;
y: a number not necessarily an integer;
m: an integer from 1 to 4;
n: an integer from 1 to 6;
A: said first metal element selected from a first group consisting of yttrium (Y), lanthanum (La), cerium (Ce), paraseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), lithium (Li), sodium (Na), potassium (K), rubidium (Rb), cesium (Cs), magnesium (Mg), calcium (Ca), strontium (Sr), barium (Ba), aluminium (Al), and silicon (Si); and
B: said second metal element selected from a second group consisting of vanadium (V), gallium (Ga), molybdenum (Mo), palladium (Pd), silver (Ag), indium (In), tin (Sn), antimony (Sb), tungsten (W), and bismuth (Bi);
milling and mixing said carbonates of the first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;
milling said pre-baked and annealed slurry to provide a powder; and
baking said powder at a fourth temperature that is higher than said third temperature to form said compound oxide.

15. A method of producing compound oxides, the method comprising the steps of:
preparing carbonates of first and second elements of a compound oxide which is expressed by the following formula:

$A_nB_mO_y$ where,
- O: oxygen;
- y: a number not necessarily an integer;
- m: an integer from 1 to 4;
- n: an integer from 1 to 6;
- A: said first metal element selected from a first group consisting of yttrium (Y), lanthanum (La), neodymium (Nd), gadolinium (Gd), sodium (Na) potassium (K), calcium (Ca), strontium (Sr) and barium (Ba); and
- B: said second metal element selected from a second group consisting of nickel (Ni), cobalt (Co), copper (Cu), and manganese (Mn);

milling and mixing said carbonates of the first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;
milling said pre-baked and annealed slurry to provide a powder; and
baking said powder at a fourth temperature that is higher than said third temperature to form said compound oxide.

16. A method as claimed in claim 15, wherein said first temperature falls in a first range from 40° to 120° C.

17. A method as claimed in claim 16, wherein said second temperature falls in a second range from 50° to 120° C.

18. A method as claimed in claim 17, wherein said third temperature is 900° C. at the highest.

19. A method as claimed in claim 18, wherein said fourth temperature falls in a range from 940° to 960° C.

20. A method of producing superconductive compound oxides, the method comprising the steps of:
preparing carbonates of first and second elements of a superconductive compound oxide which is expressed by the following formula:

$A_nCu_mO_y$ where,
- O: oxygen;
- y: an integer;
- m: an integer from 1 to 4;
- n: an integer from 1 to 6; and
- A: said first metal element selected from a first group consisting of yttrium (Y), lanthanum (La), neodymium (Nd), gadolinium (Gd), sodium (Na), potassium (K), calcium (Ca), strontium (Sr) and barium (Ba);

milling and mixing said carbonates of said first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;
milling said pre-baked and annealed slurry to provide a powder; and
baking said powder at a fourth temperature that is higher than said third temperature to form said superconductive compound oxide.

21. A method of producing superconductive compound oxides, the method comprising the steps of:
preparing carbonates of first and second metal elements of a superconductive compound oxide which is expressed the following formula:

$A_nCu_mO_y$ where,
- O: oxygen;
- y: an integer;
- m: an integer from 1 to 4;
- n: an integer from 1 to 6; and
- A: said first metal element selected from a group consisting of yttrium (Y), and barium (Ba);

milling and mixing said carbonates of said first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;
milling and mixing said pre-baked and annealed slurry to provide a powder; and
baking said powder at a fourth temperature that is higher than said third temperature to form said superconductive compound oxide.

22. A method as claimed in claim 21, wherein said first temperature falls in a first range 65°±5° C. and said second predetermined temperature is 90° C.

23. A method of producing compound oxides, the method comprising the steps of:
preparing carbonates of first and second elements of a compound oxide which is expressed by the following formula:

$A_nB_mO_y$ where,
- O: oxygen;
- y: a number not necessarily an integer;
- m: an integer from 1 to 4;
- n: an integer from 1 to 6;
- A: a metal element selected from a first group consisting of yttrium (Y) and a rare earth element; and
- B: a metal element selected from the group consisting of non-rare earth metal transition metals, alkaline earth metals and alkali metal elements;

milling and mixing said carbonates of said first and second metal elements to produce a mixture;
adding citric acid and purified water to said mixture to initiate reaction at a first temperature to form a slurry;
dehydrating said slurry at a second temperature to form a crystalline citrate composite;
pre-baking said dehydrated slurry at a third temperature;
annealing said pre-baked slurry;

milling said pre-baked and annealed slurry to provide a powder; and baking said powder at a fourth temperature that is higher than said third temperature to form said compound oxide.

24. The method according to claim 23 where the rare earth metals are yttrium (Y), lanthanum (La), neodymium (Nd), and gadolinium (Gd).

25. The method according to claim 24 where the alkali metals are sodium (Na) and potassium (K).

26. The method according to claim 23 where the alkaline earth metals are magnesium (Mg), calcium (Ca), strontium (Sr), and barium (Ba).

27. The method according to claim 26 where the non-rare earth metals are cobalt (Co), nickel (Ni), and copper (Cu).

* * * * *